(12) United States Patent
Zhao (10) Patent No.: US 11,377,723 B2
(45) Date of Patent: Jul. 5, 2022

(54) METHOD OF PATTERNING QUANTUM DOTS, DEVICE USING SAME, AND SYSTEM THEREOF

(71) Applicant: TCL CHINA STAR OPTOELECTRONICS TECHNOLOGY CO., LTD., Guangdong (CN)

(72) Inventor: Jinyang Zhao, Guangdong (CN)

(73) Assignee: TCL CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 310 days.

(21) Appl. No.: 16/759,748

(22) PCT Filed: Apr. 14, 2020

(86) PCT No.: PCT/CN2020/084579
§ 371 (c)(1),
(2) Date: Apr. 28, 2020

(87) PCT Pub. No.: WO2021/196269
PCT Pub. Date: Oct. 7, 2021

(65) Prior Publication Data
US 2021/0301385 A1   Sep. 30, 2021

(51) Int. Cl.
*C23C 14/04* (2006.01)
*H01L 51/50* (2006.01)
(Continued)

(52) U.S. Cl.
CPC .......... *C23C 14/04* (2013.01); *C09K 11/7492* (2013.01); *C09K 11/883* (2013.01);
(Continued)

(58) Field of Classification Search
CPC ......... B82Y 10/00; B82Y 20/00; B82Y 30/00; B82Y 40/00; C09K 11/7492; C09K 11/883; H01L 33/005; H01L 51/0014; H01L 51/502; H01L 51/56; C23C 14/04
See application file for complete search history.

(56) References Cited

U.S. PATENT DOCUMENTS

| 2007/0194297 | A1  | 8/2007 | McCarthy et al. |
| 2012/0097225 | A1* | 4/2012 | Nomura .......... H01L 31/035236 136/255 |
| 2017/0261789 | A1* | 9/2017 | Deng .................... G02F 1/1362 |

FOREIGN PATENT DOCUMENTS

| CN | 1447294 A | 10/2003 |
| CN | 1727884 A | 2/2006 |

(Continued)

*Primary Examiner* — Allan R Wilson
(74) *Attorney, Agent, or Firm* — Mark M. Friedman (57) ABSTRACT

A method of patterning quantum dots, a device using same, and a system thereof are provided. By providing a base between a plurality of upper electrodes and a plurality of lower electrodes, coating a quantum dot solution on an upper surface of the base, and powering the upper electrodes and the lower electrodes to form an electric field between the upper electrodes and the lower electrodes, the quantum dot solution is gathered between the upper electrodes and the lower electrodes according to an electric field distribution. Subsequently, the quantum dot solution can be deposited into a film by evaporation of a solvent, thereby obtaining a patterned quantum dot thin film on the base.

20 Claims, 5 Drawing Sheets

(51) Int. Cl.
  *H01L 51/56*   (2006.01)
  *C09K 11/88*   (2006.01)
  *H01L 51/00*   (2006.01)
  *C09K 11/74*   (2006.01)
  *B82Y 10/00*   (2011.01)
  *B82Y 20/00*   (2011.01)
  *B82Y 30/00*   (2011.01)
  *B82Y 40/00*   (2011.01)

(52) U.S. Cl.
  CPC ........ *H01L 51/0014* (2013.01); *H01L 51/502* (2013.01); *H01L 51/56* (2013.01); *B82Y 10/00* (2013.01); *B82Y 20/00* (2013.01); *B82Y 30/00* (2013.01); *B82Y 40/00* (2013.01)

(56) References Cited

FOREIGN PATENT DOCUMENTS

| | | | | |
|---|---|---|---|---|
| CN | 1831083 | A | 9/2006 | |
| CN | 101405866 | A | 4/2009 | |
| CN | 101974776 | A | 2/2011 | |
| CN | 102431964 | A | 5/2012 | |
| CN | 102543731 | A | 7/2012 | |
| CN | 103332649 | A | 10/2013 | |
| CN | 104291328 | A | 1/2015 | |
| CN | 104556004 | A | 4/2015 | |
| CN | 106479503 | A | 3/2017 | |
| CN | 106549111 | A | 3/2017 | |
| CN | 107011899 | A | 8/2017 | |
| CN | 108165990 | A | 6/2018 | |
| CN | 108962965 | A * | 12/2018 | ............. H01L 27/32 |
| CN | 109239829 | A | 1/2019 | |
| CN | 110137183 | A | 8/2019 | |
| CN | 110277425 | A | 9/2019 | |
| CN | 110293043 | A | 10/2019 | |
| CN | 110611244 | A | 12/2019 | |
| CN | 110660932 | A | 1/2020 | |
| CN | 110711607 | A | 1/2020 | |
| CN | 110780488 | A | 2/2020 | |
| WO | 2016153461 | | 9/2016 | |

* cited by examiner

METHOD OF PATTERNING QUANTUM DOTS, DEVICE USING SAME, AND SYSTEM THEREOF

FIELD OF INVENTION

Embodiments of the present application relate to a technical field of quantum dots, and in particular, to a method of patterning quantum dots, a device using same, and a system thereof.

BACKGROUND OF INVENTION

Size of structural units of nanomaterials ranges from 1 nanometer to 100 nanometers, which is close to a coherence length of electrons, and nanomaterial properties are greatly changed due to self-organization brought by strong coherence. Moreover, scale of the nanomaterials is close to a wavelength of light, and they possess volume effect, surface effect, quantum size effect, and macroscopic quantum tunneling effect. Therefore, they have unique properties in melting point, magnetism, optics, thermal conductivity, electrical conductivity, etc., making them have important application value in many fields.

Quantum dots (QDs) are a typical type of nanomaterials, which have characteristics of small size and high energy conversion efficiency. They have very important application prospects in fields of lighting, display technology, solar cells, optical switches, sensing, and detection. Moreover, the quantum dots also have characteristics of high brightness, narrow emission, adjustable light emission color, good stability, etc., which are in line with the development trend of ultra-thin, bright, high color gamut, and high color saturation in the field of display technology. Therefore, quantum dots have become the most promising new material for display technology in recent years.

Development of patterning technology of nano-materials such as quantum dots has important value for their application in the fields of LED, display technology, solar cells, optical switches, sensing, and detection. At present, the technology of patterning quantum dots mainly includes inkjet printing and photolithography. Among them, heating, ultraviolet curing, and washing developer in the photolithography process will affect stability of the quantum dots, while ink requirements of the inkjet printing process are too high and without mature and stable mass production material system at present, repeatability is poor, and preparation time is long. Therefore, inkjet printing and photolithography all greatly restrict development and application of patterning quantum dots.

SUMMARY OF INVENTION

Technical Problem

The present application provides a method of patterning quantum dots, device using same, and system thereof to solve problems of affect stability of the quantum dots that heating, ultraviolet curing, and developer washing of the photolithography process in conventional patterning quantum dot technology, and technical problems of ink requirements too high, poor repeatability, and long preparation time of the inkjet printing process.

Technical Solution

Embodiments of the present application provide a method of patterning quantum dots, device using same, and system thereof.

In a first aspect, an embodiment of the present application provides a method of patterning quantum dots. The method of patterning the quantum dots includes following steps: providing a base, wherein a lower electrode substrate is arranged in parallel below the base, and a plurality of lower electrodes are provided on an upper surface of the lower electrode substrate; arranging an upper electrode substrate in parallel above the base, wherein a plurality of upper electrodes opposite to the lower electrodes are provided on a lower surface of the upper electrode substrate; coating a quantum dot solution on an upper surface of the base, and powering the upper electrodes and the lower electrodes to make the quantum dot solution gather between the upper electrodes and the lower electrodes; and evaporating the quantum dot solution to form a patterned quantum dot thin film on the upper surface of the base.

In some embodiments, before the step of providing the base, the method further comprises providing a foundation, and arranging the base above the foundation through support posts.

In some embodiments, the step of evaporating the quantum dot solution comprises heating, vacuuming, or ultraviolet curing the quantum dot solution to volatilize the quantum dot solution to form the patterned quantum dot thin film.

In some embodiments, a thickness of the base is less than 0.5 mm.

In a second aspect, an embodiment of the present application provides a device of patterning quantum dots, the device of patterning quantum dots includes a lower electrode substrate, a plurality of lower electrodes, a base, a plurality of upper electrodes, and an upper electrode substrate arranged sequentially from bottom to top; wherein the upper electrodes are provided on a lower surface of the upper electrode substrate, the lower electrodes are provided on an upper surface of the lower electrode substrate, the upper electrodes and the lower electrodes are arranged opposite to each other, an upper surface of the base is coated with a quantum dot solution, and the quantum dot solution is interposed between the upper electrodes and the lower electrodes.

In some embodiments, the device of patterning the quantum dots further comprising a foundation and support posts, wherein the base is disposed above the foundation through the support posts, and the lower electrode substrate is positioned above the foundation.

In some embodiments, the upper electrodes and the lower electrodes comprise same cross-sections and one-to-one correspondence, the upper electrodes are electrically connected to each other through a plurality of traces other than the upper electrode substrate, and the lower electrodes are electrically connected to each other through a plurality of traces other than the lower electrode substrate.

In some embodiments, the upper electrodes and the lower electrodes comprise different cross sections and horizontal projections partially overlap, the upper electrodes are powered by the upper electrode substrate, and the lower electrodes are powered by the lower electrode substrate.

In some embodiments, the upper electrodes are electrically connected to each other through a plurality of first traces on the lower surface of the upper electrode substrate, the lower electrodes are electrically connected to each other through a plurality of second traces on the upper surface of the lower electrode substrate, and directions of the first traces and the second traces are different.

In some embodiments, the first traces and the second traces are perpendicular to each other.

In some embodiments, diameters of the first traces and the second traces are both less than 200 µm.

In some embodiments, a thickness of the base is less than 0.5 mm.

In a third aspect, an embodiment of the present application provides a system of patterning quantum dots including a device of patterning quantum dots as described above, a power supply, and an evaporation device, wherein the power supply is used to apply voltage to a plurality of upper electrodes and a plurality of lower electrodes, and the evaporation device is used to evaporate the quantum dot solution. The device of patterning quantum dots comprises a lower electrode substrate, a plurality of lower electrodes, a base, a plurality of upper electrodes, and an upper electrode substrate arranged sequentially from bottom to top, and wherein the upper electrodes are provided on a lower surface of the upper electrode substrate, the lower electrodes are provided on an upper surface of the lower electrode substrate, the upper electrodes and the lower electrodes are arranged opposite to each other, an upper surface of the base is coated with a quantum dot solution, and the quantum dot solution is interposed between the upper electrodes and the lower electrodes.

In some embodiment, the device of patterning quantum dots further comprises a foundation and support posts, the base is disposed above the foundation through the support posts, and the lower electrode substrate is positioned above the foundation.

In some embodiment, the upper electrodes and the lower electrodes comprise same cross-sections and one-to-one correspondence, the upper electrodes are electrically connected to each other through a plurality of traces other than the upper electrode substrate, and the lower electrodes are electrically connected to each other through a plurality of traces other than the lower electrode substrate.

In some embodiment, the upper electrodes and the lower electrodes comprise different cross sections and horizontal projections partially overlap, the upper electrodes are powered by the upper electrode substrate, and the lower electrodes are powered by the lower electrode substrate.

In some embodiment, the upper electrodes are electrically connected to each other through a plurality of first traces on the lower surface of the upper electrode substrate, the lower electrodes are electrically connected to each other through a plurality of second traces on the upper surface of the lower electrode substrate, and directions of the first traces and the second traces are different.

In some embodiment, the first traces and the second traces are perpendicular to each other.

In some embodiment, diameters of the first traces and the second traces are both less than 200 µm.

In some embodiment, a thickness of the base is less than 0.5 mm.

Beneficial Effect

Embodiments of the present application provide a method of patterning quantum dots, a device using same, and a system thereof. By powering the upper electrodes and the lower electrodes to form an electric field between the upper electrodes and the lower electrodes, quantum dot solution is gathered between the upper electrodes and the lower electrodes according to an electric field distribution. Subsequently, the quantum dot solution is deposited into a film by evaporation of a solvent, and a patterned quantum dot thin film is obtained on the base. The embodiments of the present application do not require special treatment on the base, such as processing patterned electrodes on the base, a patterned quantum dot thin film can be obtained, and requirement of a formulation system of the quantum dot solution is low. The method is simple and suitable for large-scale production, and widespread application of patterned quantum dots can be enhanced.

BRIEF DESCRIPTION OF FIGURES

FIG. 6 (a) is a schematic structural diagram of upper electrodes of a first pair of electrodes according to an embodiment of the present application.

FIG. 6 (b) is a schematic structural diagram of lower electrodes of the first pair of electrodes according to an embodiment of the present application.

FIG. 7 (a) is a schematic structural diagram of upper electrodes of a second pair of electrodes according to an embodiment of the present application.

FIG. 7 (b) is a schematic structural diagram of lower electrodes of the second pair of electrodes according to an embodiment of the present application.

FIG. 8 (a) is a schematic structural diagram of upper electrodes of a third pair of electrodes according to an embodiment of the present application.

FIG. 8 (b) is a schematic structural diagram of lower electrodes of the third pair of electrodes according to an embodiment of the present application.

DETAILED DESCRIPTION OF EMBODIMENTS

In order to illustrate the technical solutions of the present application or the related art in a clearer manner, the drawings desired for the present application or the related art will be described hereinafter briefly. Obviously, the following drawings merely relate to some embodiments of the present application, and based on these drawings, a person skilled in the art may obtain the other drawings without any creative effort.

Figure 1:
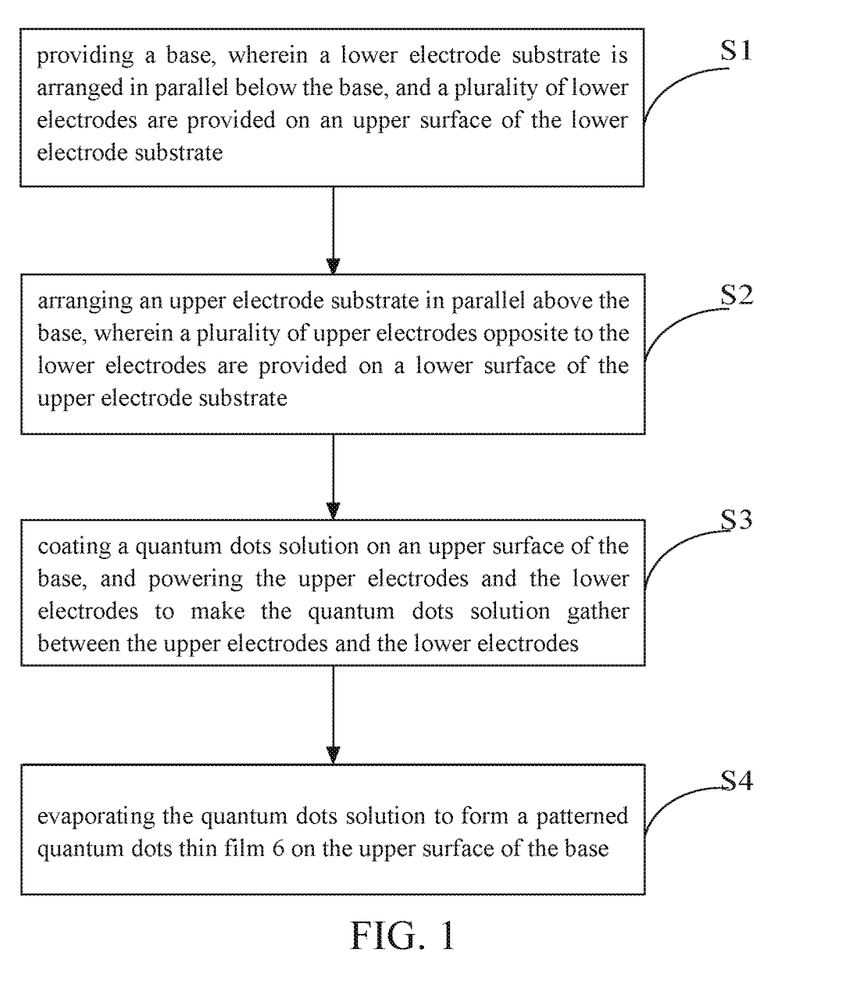
FIG. 1 is a schematic flowchart of a method of patterning quantum dots according to an embodiment of the present application.
Figure 2:
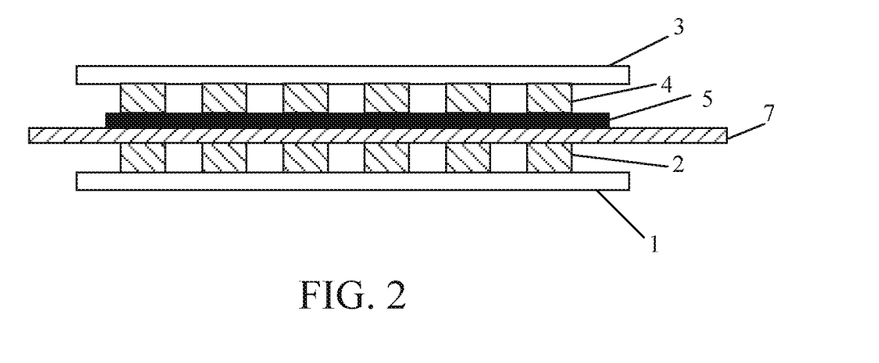
FIG. 2 is a schematic structural diagram of a device of patterning quantum dots according to an embodiment of the present application.
Figure 3:
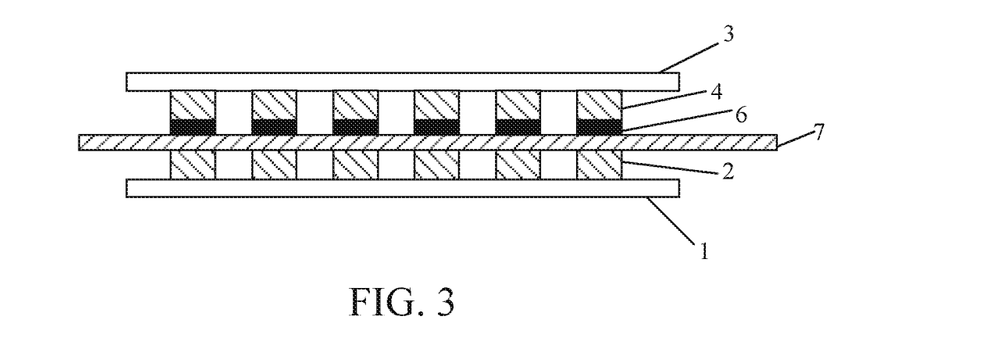
FIG. 3 is a schematic process diagram of the method of patterning quantum dots according to an embodiment of the present application.

FIG. 1 is a schematic flowchart of a method of patterning quantum dots according to an embodiment of the present application, FIG. 2 is a schematic structural diagram of a device of patterning quantum dots according to an embodiment of the present application, and FIG. 3 is a schematic process diagram of the method of patterning quantum dots according to an embodiment of the present application. Combining FIG. 1, FIG. 2, and FIG. 3, the method includes steps as follows.

S1, providing a base 7, wherein a lower electrode substrate 1 is arranged in parallel below the base 7, and a plurality of lower electrodes 2 are provided on an upper surface of the lower electrode substrate 1.

S2, arranging an upper electrode substrate 3 in parallel above the base 7, wherein a plurality of upper electrodes 4 opposite to the lower electrodes are provided on a lower surface of the upper electrode substrate 3.

S3, coating a quantum dot solution 5 on an upper surface of the base 7, and powering the upper electrodes 4 and the lower electrodes 2 to make the quantum dot solution 5 gather between the upper electrodes 4 and the lower electrodes 2.

S4, evaporating the quantum dot solution 5 to form a patterned quantum dot thin film 6 on the upper surface of the base 7.

Figure 4:
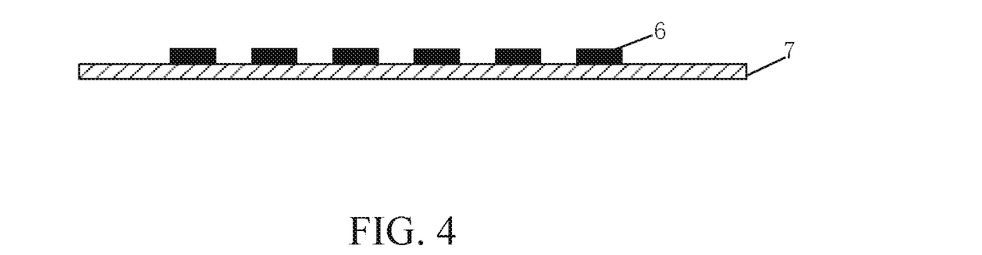
FIG. 4 is a schematic diagram of a quantum dot thin film produced by the method of patterning quantum dots according to the embodiment of the present application.

In addition, FIG. 4 is a schematic diagram of a quantum dot thin film produced by the method of patterning quantum dots according to the embodiment of the present application. It can be understood that the quantum dot thin film 6 in FIG. 3 has been formed on the upper surface of the base 7 through step S4, and by removing the upper electrode substrate 3, the upper electrodes 4, the lower electrode substrate 1, and the lower electrodes 2, the quantum dot thin film 6 on the upper surface of the base 7 shown in FIG. 4 can be obtained.

Specifically, embodiments of the present application provide the base 7 based on the principle that an electric field drives colloidal quantum dots to move and gather in the electric field, and the lower electrodes 2 are arranged below the base 7 through the lower electrode substrate 1, the upper electrodes 4 are arranged above the base 7 through the upper electrode substrate 3, and the lower electrodes 2 and the upper electrodes 4 are oppositely arranged, thereby forming a sandwich structure consisting of the lower electrodes 2, the base 7, and the upper electrodes 4. The quantum dot solution 5 is coated on the base 7, and the lower electrodes 2 and the upper electrodes 4 are powered to form the electric field between the upper and lower electrodes, so that the quantum dot solution 5 is gathered between the upper electrodes and the lower electrodes according to an electric field distribution. Subsequently, the quantum dot solution 5 can be deposited into a film by evaporation of a solvent, thereby obtaining the patterned quantum dot thin film 6 on the base 7.

In the method of patterning quantum dots according to the embodiment of the present application, since the quantum dot solution 5 on the base 7 will gather at the upper and lower electrodes in the electric field between the upper and lower electrodes, the evaporation of the quantum dot solution 5 can make the quantum dot thin film 6 be formed at the upper and lower electrodes, so that the patterned quantum dot thin film 6 is obtained on the base 7. The embodiments of the present application do not require special treatment for the base 7, such as processing a patterned electrode on the base 7, to obtain the patterned quantum dot thin film 6. Moreover, requirement of a formulation system of the quantum dot solution is low, the method is simple and suitable for large-scale production, and widespread application of patterned quantum dots can be enhanced, so that they can be used in quantum dot color filter (QDCF), quantum dot light guide plate (QDLGP), quantum dot light-emitting diodes (QLED), quantum dot organic light-emitting diodes (QD-OLED), and other fields of quantum dot display and nanoparticles patterning process.

Figure 5:
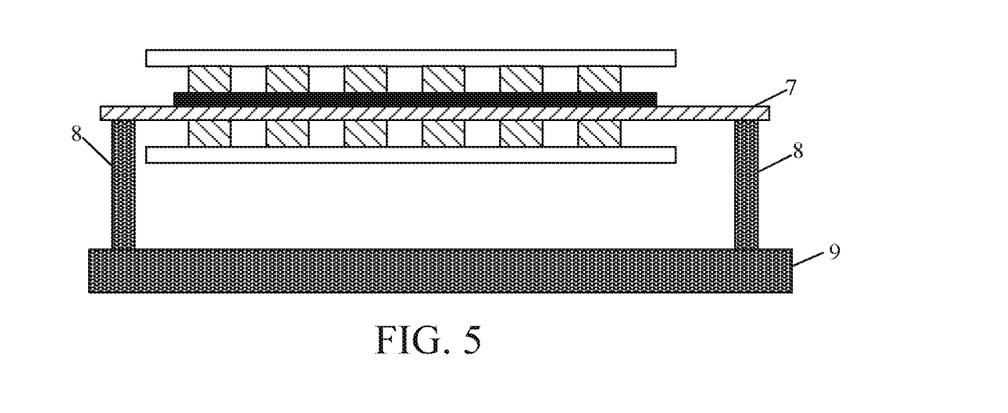
FIG. 5 is another schematic structural diagram of the device of patterning quantum dots according to an embodiment of the present application.

Furthermore, FIG. 5 is another schematic structural diagram of the device of patterning quantum dots according to an embodiment of the present application. Referring to FIG. 5, before "providing a base 7" in step S1, the method further includes providing a foundation 9 below the lower electrode substrate 1, and disposing the base 7 above the foundation 9 through support posts 8, so that the sandwich structure consisting of the lower electrodes 2, the base 7, and the upper electrodes 4 is provided above the foundation 9 through the support posts 8. In order to maintain balance, there are a plurality of support posts 8.

Furthermore, the "evaporating the quantum dot solution 5" in step S4 specifically includes heating, vacuuming, or ultraviolet curing the quantum dot solution 5 to volatilize the quantum dot solution 5 to form the patterned quantum dot thin film 6.

Referring to FIG. 2, an embodiment of the present application further provides a device of patterning quantum dots, which includes a lower electrode substrate 1, a plurality of lower electrodes 2, a base 7, a plurality of upper electrodes 4, and an upper electrode substrate 3 arranged sequentially from bottom to top. The upper electrodes 4 are provided on a lower surface of the upper electrode substrate 3, the lower electrodes 2 are provided on an upper surface of the lower electrode substrate 1, the upper electrodes 4 and the lower electrodes 2 are arranged opposite to each other, an upper surface of the base 7 is coated with a quantum dot solution 5, and the quantum dot solution 5 is interposed between the upper electrodes 4 and the lower electrodes 2.

Specifically, the base 7 is positioned between the plurality of upper electrodes 4 and the plurality of lower electrodes 2, thereby forming a sandwich structure consisting of the lower electrodes 2, the base 7, and the upper electrodes 4. The base 7 is for coating by the quantum dot solution 5, and the upper and lower electrodes are used for powering to form an electric field between the upper and lower electrodes, so that the quantum dot solution 5 is gathered between the upper electrodes 4 and the lower electrodes 2 according to the electric field distribution. Subsequently, the quantum dot solution 5 can be deposited into a film by evaporation of a solvent, thereby obtaining a patterned quantum dot thin film 6 on the base 7.

Furthermore, the device of patterning quantum dots further includes a foundation 9 and support posts 8. The base 7 is disposed above the foundation 9 through the support posts 8, and the lower electrode substrate 1 is positioned above the foundation 9, so that the sandwich structure consisting of the lower electrodes 2, the base 7, and the upper electrodes 4 is disposed above the foundation 9 through the support posts 8.

It should be noted that quantum dot materials in the embodiments of the present application include a light-emitting core, an inorganic protective shell, high-stability composite quantum dots, and perovskite quantum dots, wherein material of the light-emitting core includes one or more of $ZnCdSe_2$, InP, $Cd_2SSe$, CdSe, $Cd_2SeTe$, and InAs, material of the inorganic protective shell includes one or more of CdS, ZnSe, $ZnCdS_2$, ZnS, and ZnO, and material of the high-stability composite quantum dots includes hydrogel loaded quantum dots and $CdSe$—$SiO_2$, etc. A quantum dot dispersion media includes colorless and transparent low boiling point volatile organic or inorganic reagents. Surface ligands of the quantum dots include common quantum dot organic ligands, such as amines, acids, mercaptan, organic phosphorus, etc.

Moreover, the embodiments of the present application are also applicable to other nanomaterials, such as inorganic nanoparticles, precious metal nanoparticles, colloidal nanosheets, and colloidal nanorods.

In addition, material of the upper electrodes 4 and the lower electrodes 2 of the embodiments of the present application includes indium tin oxide (ITO) semiconductor, graphene, metal, transition metal chalcogenide compounds ($MoS_2$, $MoSe_2$, $WS_2$, $WSe_2$), etc. Material of the upper electrode substrate 3 and the lower electrode substrate 1 in the present application includes glass, plexiglass, hard insulating film materials, soft insulating film materials, and the like.

It should also be noted that a thickness of the base 7 in the embodiments of the present application cannot be too thick. Otherwise a large voltage needs to be applied to the upper electrodes 4 and the lower electrodes 2 to form an electric field strength that can enable the quantum dot solution 5 to gather, and this is unnecessary, therefore, the thickness of the base 7 should be less than 0.5 mm.

It can be understood that a specific shape of the quantum dot thin film 6 finally formed by the quantum dot solution 5 depends on a cross-sectional shape of the upper electrodes and the lower electrodes. Therefore, the embodiments of the present application perform following three different designs on the upper and lower electrodes, that is, a pair of electrodes.

Figure 6A:
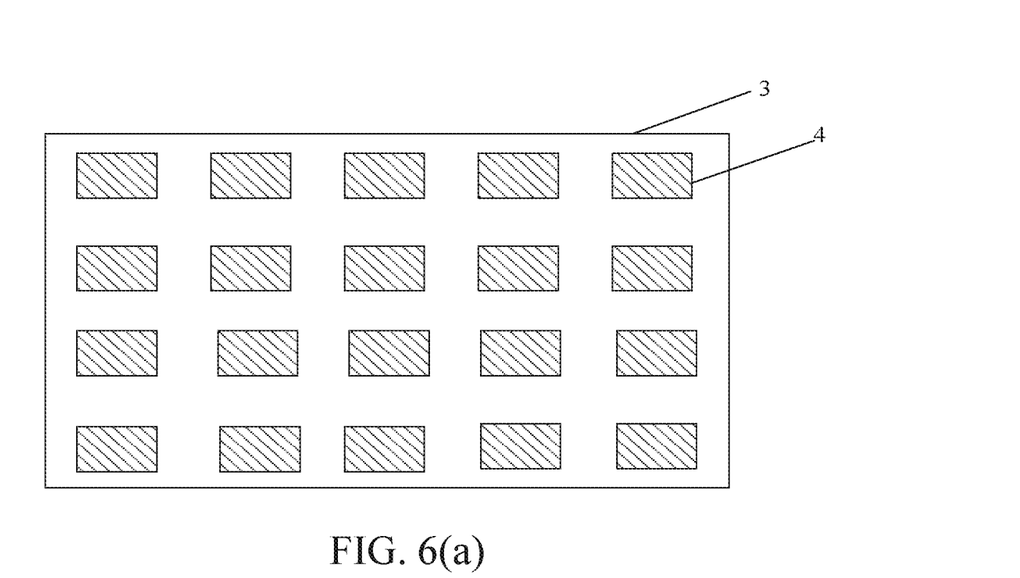
Figure 6B:
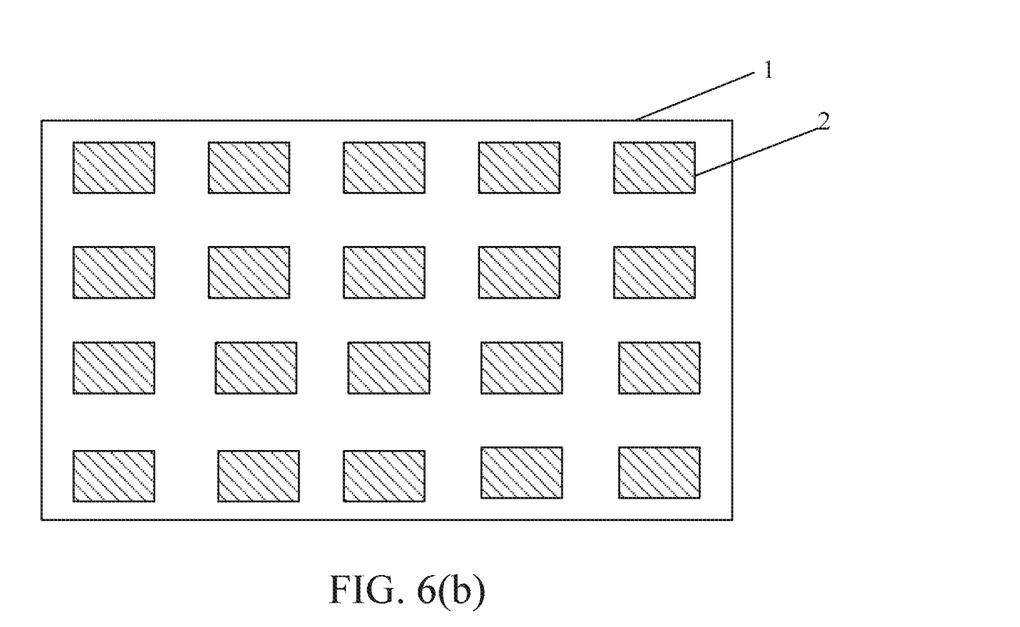

FIG. 6 (a) is a schematic structural diagram of upper electrodes of a first pair of electrodes according to an embodiment of the present application, and FIG. 6 (b) is a schematic structural diagram of lower electrodes of the first pair of electrodes according to an embodiment of the present application. Referring to FIG. 6 (a) and FIG. 6 (b), the upper electrodes 4 and the lower electrodes 2 include same cross-sections (cross-sectional shape and area are exactly same) and one-to-one correspondence, the upper electrodes 4 are electrically connected to each other through a plurality of traces other than the upper electrode substrate 3, and the lower electrodes 2 are electrically connected to each other through a plurality of traces other than the lower electrode substrate 1. In this way, the base 7 has only electrode patterns and no trace, and the upper and lower electrodes are connected by the traces other than the upper electrode substrate and the lower electrode substrate, respectively, so a structure of the upper and lower electrode substrates is more complicated.

Figure 7A:
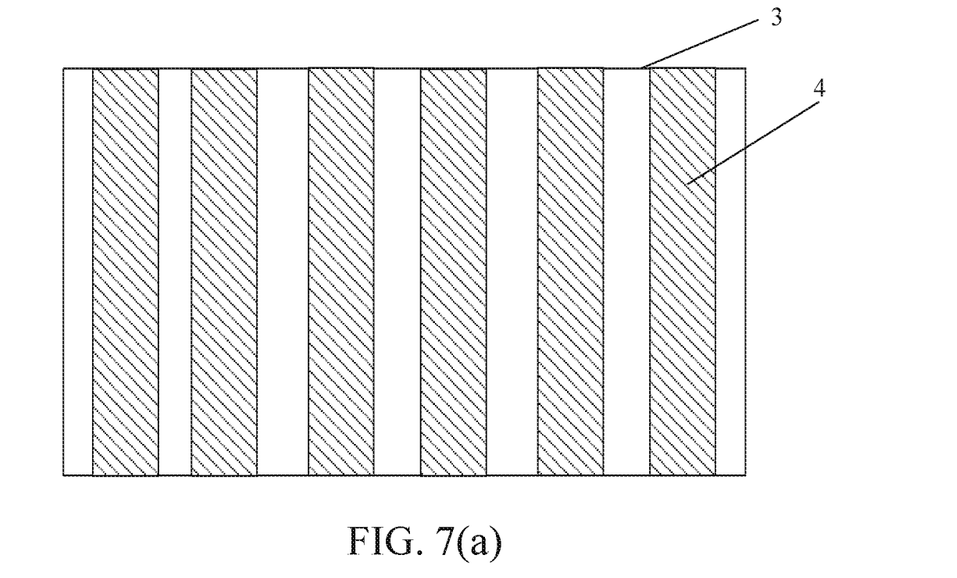
Figure 7B:
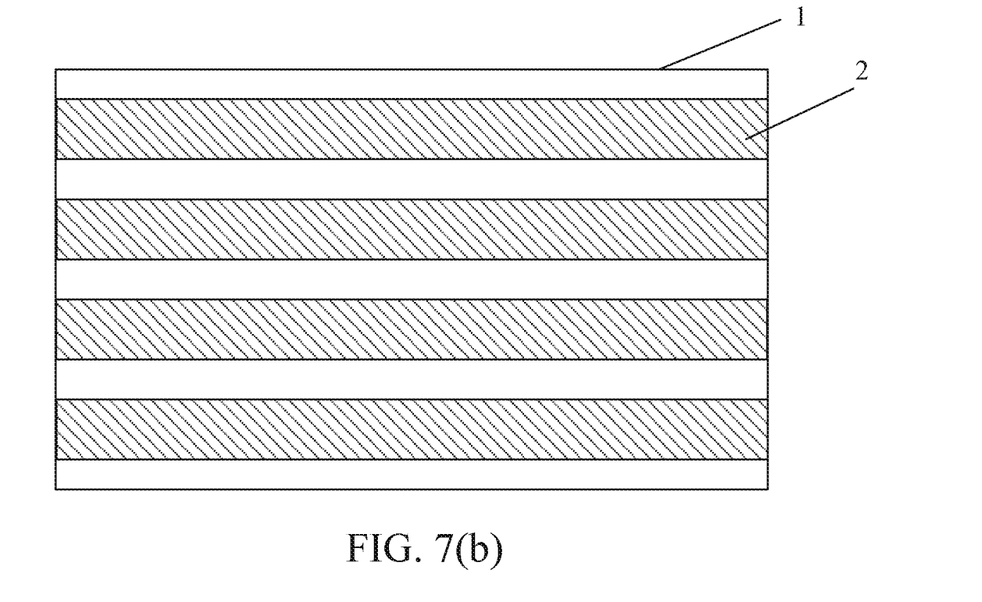

FIG. 7 (a) is a schematic structural diagram of upper electrodes of a second pair of electrodes according to an embodiment of the present application, and FIG. 7 (b) is a schematic structural diagram of lower electrodes of the second pair of electrodes according to an embodiment of the present application. Referring to FIG. 7 (a) and FIG. 7 (b), the upper electrodes 4 and the lower electrodes 2 include different cross-sections (cross-sectional shape and area are not exactly same) and horizontal projections partially overlap, for example, in FIG. 7 (a) and FIG. 7 (b), each of the upper electrodes 4 has a horizontal stripe shape, and each of the lower electrodes 2 has a vertical stripe shape. The upper electrodes 4 are powered by the upper electrode substrate 3, and the lower electrodes 2 are powered by the lower electrode substrate 1. In this way, the upper electrodes and the lower electrodes are inconsistent, and an overlapping region of the two is used to generate an electric field, so that the quantum dot solution 5 gathers in the overlapping region. The upper and lower electrodes are in a form of planar electrodes, which allow the upper and lower electrodes to be powered by directly powering the upper and lower electrode substrates.

Figure 8A:
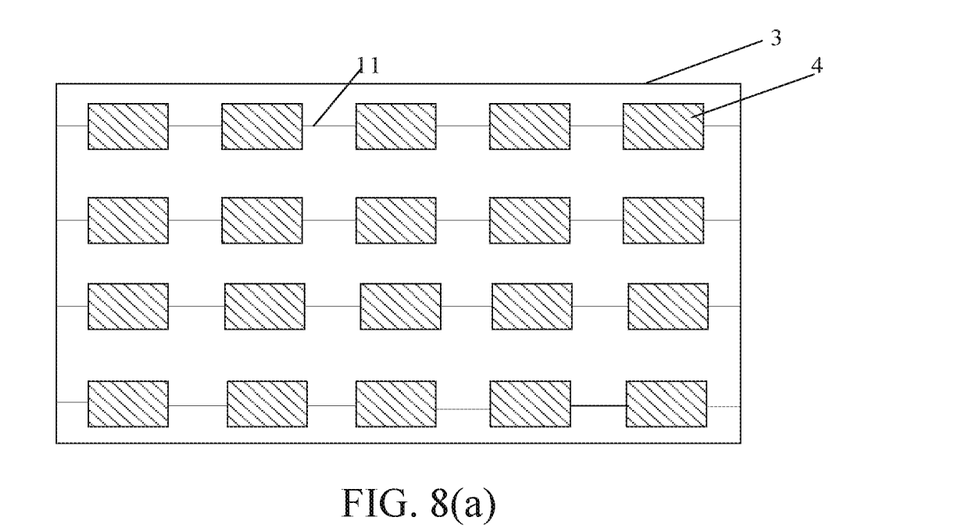
Figure 8B:
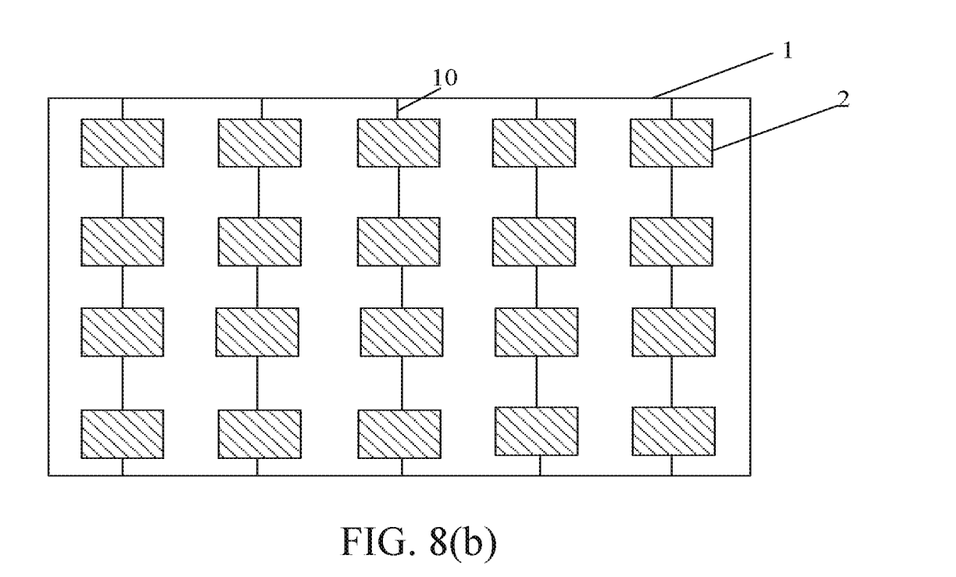

FIG. 8 (a) is a schematic structural diagram of upper electrodes of a third pair of electrodes according to an embodiment of the present application, and FIG. 8 (b) is a schematic structural diagram of lower electrodes of the third pair of electrodes according to an embodiment of the present application. Referring to FIG. 8 (a) and FIG. 8 (b), a plurality of upper electrodes 4 are electrically connected to each other through a plurality of first traces 11 on a lower surface of an upper electrode substrate 3, a plurality of lower electrodes 2 are electrically connected to each other through a plurality of second traces 10 on an upper surface of a lower electrode substrate 1, and directions of the first traces 11 and the second traces 10 are different (first traces 11 and second traces 10 are not parallel to each other), for example, the first traces 11 and the second traces 10 in FIG. 8 (a) and FIG. 8 (b) are perpendicular to each other. In this way, the upper and lower electrodes are connected to each other by very thin (for example, a diameter less than 200 μm) first traces 11 and second traces 10, and the directions of the first traces 11 and the second traces 10 are different. This can effectively reduce an electric field between the traces, meanwhile, the upper and lower electrodes are in a form of planar electrodes, which can reduce difficulty of electrode processing.

It can be understood that in the above three electrode designs, the cross-sectional shapes of the upper and lower electrodes can be set according to requirements, such as circular, rectangular, diamond, or triangular, which is not limited herein.

An embodiment of the present application also provides a system of patterning quantum dots, which includes the device of patterning quantum dots as described above, a power supply, and an evaporation device, wherein the power supply is used to apply voltage to a plurality of upper electrodes and a plurality of lower electrodes, and the evaporation device is used to evaporate the quantum dot solution.

In above embodiments, description of each embodiment has its own emphasis. For a part that is not detailed in an embodiment, it can be refer to related descriptions of other embodiments.

The present document uses specific embodiments to explain principles and implementation of the application. Descriptions of above embodiments are only used to help understand technical solutions and core ideas of the application. A person skilled in the art can make various modifications and changes to the above embodiments without departing from the technical idea of the present invention, and such variations and modifications are intended to be within the scope of the invention.

What is claimed is:

1. A method of patterning quantum dots, comprising following steps:
providing a base, wherein a lower electrode substrate is arranged in parallel below the base, and a plurality of lower electrodes are provided on an upper surface of the lower electrode substrate;
arranging an upper electrode substrate in parallel above the base, wherein a plurality of upper electrodes opposite to the lower electrodes are provided on a lower surface of the upper electrode substrate;
coating a quantum dot solution on an upper surface of the base, and powering the upper electrodes and the lower electrodes to make the quantum dot solution gather between the upper electrodes and the lower electrodes; and
evaporating the quantum dot solution to form a patterned quantum dot thin film on the upper surface of the base.

2. The method of patterning the quantum dots according to claim 1, wherein before the step of providing the base, the method further comprises providing a foundation, and arranging the base above the foundation through support posts.

3. The method of patterning the quantum dots according to claim 1, wherein the step of evaporating the quantum dot solution comprises heating, vacuuming, or ultraviolet curing the quantum dot solution to volatilize the quantum dot solution to form the patterned quantum dot thin film.

4. The method of patterning the quantum dots according to claim 1, wherein a thickness of the base is less than 0.5 mm.

5. A device of patterning quantum dots, comprising:
a lower electrode substrate, a plurality of lower electrodes, a base, a plurality of upper electrodes, and an upper electrode substrate arranged sequentially from bottom to top;
wherein the upper electrodes are provided on a lower surface of the upper electrode substrate, the lower electrodes are provided on an upper surface of the lower electrode substrate, the upper electrodes and the lower electrodes are arranged opposite to each other, an upper surface of the base is coated with a quantum dot solution, and the quantum dot solution is interposed between the upper electrodes and the lower electrodes.

6. The device of patterning the quantum dots according to claim 5, further comprising a foundation and support posts, wherein the base is disposed above the foundation through the support posts, and the lower electrode substrate is positioned above the foundation.

7. The device of patterning the quantum dots according to claim 5, wherein the upper electrodes and the lower electrodes comprise same cross-sections and one-to-one correspondence, the upper electrodes are electrically connected to each other through a plurality of traces other than the upper electrode substrate, and the lower electrodes are electrically connected to each other through a plurality of traces other than the lower electrode substrate.

8. The device of patterning the quantum dots according to claim 5, wherein the upper electrodes and the lower electrodes comprise different cross-sections and horizontal projections partially overlap, the upper electrodes are powered by the upper electrode substrate, and the lower electrodes are powered by the lower electrode substrate.

9. The device of patterning the quantum dots according to claim 5, wherein the upper electrodes are electrically connected to each other through a plurality of first traces on the lower surface of the upper electrode substrate, the lower electrodes are electrically connected to each other through a plurality of second traces on the upper surface of the lower electrode substrate, and directions of the first traces and the second traces are different.

10. The device of patterning the quantum dots according to claim 9, wherein the first traces and the second traces are perpendicular to each other.

11. The device of patterning the quantum dots according to claim 9, wherein diameters of the first traces and the second traces are both less than 200 μm.

12. The device of patterning the quantum dots according to claim 5, wherein a thickness of the base is less than 0.5 mm.

13. A system of patterning quantum dots, comprising:
a device of patterning quantum dots;
a power supply; and
an evaporation device;
wherein the power supply is used to apply voltage to a plurality of upper electrodes and a plurality of lower electrodes, and the evaporation device is used to evaporate a quantum dot solution; and
wherein the device of patterning quantum dots comprises a lower electrode substrate, the plurality of lower electrodes, a base, the plurality of upper electrodes, and an upper electrode substrate arranged sequentially from bottom to top, and wherein the upper electrodes are provided on a lower surface of the upper electrode substrate, the lower electrodes are provided on an upper surface of the lower electrode substrate, the upper electrodes and the lower electrodes are arranged opposite to each other, an upper surface of the base is coated with the quantum dot solution, and the quantum dot solution is interposed between the upper electrodes and the lower electrodes.

14. The system of patterning the quantum dots according to claim 13, wherein the device of patterning quantum dots further comprises a foundation and support posts, the base is disposed above the foundation through the support posts, and the lower electrode substrate is positioned above the foundation.

15. The system of patterning the quantum dots according to claim 13, wherein the upper electrodes and the lower electrodes comprise same cross-sections and one-to-one correspondence, the upper electrodes are electrically connected to each other through a plurality of traces other than the upper electrode substrate, and the lower electrodes are electrically connected to each other through a plurality of traces other than the lower electrode substrate.

16. The system of patterning the quantum dots according to claim 13, wherein the upper electrodes and the lower electrodes comprise different cross-sections and horizontal projections partially overlap, the upper electrodes are powered by the upper electrode substrate, and the lower electrodes are powered by the lower electrode substrate.

17. The system of patterning the quantum dots according to claim 13, wherein the upper electrodes are electrically connected to each other through a plurality of first traces on the lower surface of the upper electrode substrate, the lower electrodes are electrically connected to each other through a plurality of second traces on the upper surface of the lower electrode substrate, and directions of the first traces and the second traces are different.

18. The system of patterning the quantum dots according to claim 17, wherein the first traces and the second traces are perpendicular to each other.

19. The system of patterning the quantum dots according to claim 17, wherein diameters of the first traces and the second traces are both less than 200 μm.

20. The system of patterning the quantum dots according to claim 13, wherein a thickness of the base is less than 0.5 mm.

* * * * *